US010134814B2

(12) United States Patent
Yan et al.

(10) Patent No.: US 10,134,814 B2
(45) Date of Patent: Nov. 20, 2018

(54) OLED DISPLAY DEVICE AND DISPLAY APPARATUS INCLUDING THE SAME

(71) Applicant: BOE Technology Group Co., Ltd., Beijing (CN)

(72) Inventors: Guang Yan, Beijing (CN); Chang-Yen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/321,805

(22) PCT Filed: Apr. 13, 2016

(86) PCT No.: PCT/CN2016/079179
§ 371 (c)(1),
(2) Date: Dec. 23, 2016

(87) PCT Pub. No.: WO2016/197695
PCT Pub. Date: Dec. 15, 2016

(65) Prior Publication Data
US 2017/0162634 A1   Jun. 8, 2017

(30) Foreign Application Priority Data

Jun. 11, 2015 (CN) .......................... 2015 1 0320106

(51) Int. Cl.
*H01L 27/32* (2006.01)
*H01L 51/50* (2006.01)
*H01L 51/52* (2006.01)

(52) U.S. Cl.
CPC ........ *H01L 27/3218* (2013.01); *H01L 27/322* (2013.01); *H01L 51/5012* (2013.01);
(Continued)

(58) Field of Classification Search
None
See application file for complete search history.

(56) References Cited

U.S. PATENT DOCUMENTS 6,166,489 A    12/2000  Thompson et al.
8,288,784 B2   10/2012  Cho
(Continued)

FOREIGN PATENT DOCUMENTS

CN    102024844 A    4/2011
CN    103325952 A    9/2013
(Continued)

OTHER PUBLICATIONS

First Office Action from Chinese Patent Application No. 201510320106.4, dated Jul. 3, 2017, 7 pages.
(Continued)

*Primary Examiner* — Dung Le
(74) *Attorney, Agent, or Firm* — Westman, Champlin & Koehler, P.A.

(57) ABSTRACT

An OLED display device includes a substrate and an OLED display units formed on the substrate, in which n is an integer which is greater than 1. The OLED display unit comprises: a first electrode, a first functional layer, a second electrode, a second functional layer, and a first light-emitting layer and a second light-emitting layer disposed between the first functional layer and the second functional layer; the first functional layer is disposed above the first electrode and the second functional layer is disposed below the second electrode, or, the first functional layer is disposed below the first electrode and the second functional layer is disposed above the second electrode. Wherein, the first light-emitting layer and the second light-emitting layer are disposed side by side in a horizontal direction, and, each of the light-emitting layers corresponds to at least two sub-pixels in the OLED display unit.

10 Claims, 4 Drawing Sheets

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5218* (2013.01); *H01L 51/5234* (2013.01); *H01L 27/3213* (2013.01); *H01L 2251/558* (2013.01)

(56) References Cited

U.S. PATENT DOCUMENTS

| | | |
|---|---|---|
| 8,916,859 B2 | 12/2014 | Kim et al. |
| 9,214,642 B2 | 12/2015 | Li et al. |
| 9,312,504 B2 | 4/2016 | Cheng et al. |
| 2012/0156817 A1* | 6/2012 | Jou .................... H01L 51/0004 438/35 |
| 2013/0001528 A1 | 1/2013 | Chang et al. |
| 2016/0005797 A1* | 1/2016 | Huang ................ H01L 27/3209 257/40 |
| 2017/0365806 A1* | 12/2017 | Uesaka ................ H01L 51/504 |
| 2018/0033989 A1* | 2/2018 | Lee .................... H01L 51/5004 |

FOREIGN PATENT DOCUMENTS

| | | |
|---|---|---|
| CN | 103426904 A | 12/2013 |
| CN | 203386814 U | 1/2014 |
| CN | 104617231 A | 5/2015 |
| CN | 105097876 A | 11/2015 |

OTHER PUBLICATIONS

International Search Report and Written Opinion of International Application No. PCT/CN2016/079179, dated Jul. 20, 2016, 9 pages.
English translation of Box No. V of the Written Opinion for the International Searching Authority for International Application No. PCT/CN2016/079179, 2 pages.

\* cited by examiner

OLED DISPLAY DEVICE AND DISPLAY APPARATUS INCLUDING THE SAME

CROSS-REFERENCE TO RELATED APPLICATIONS

This application is a Section 371 National Stage application of International Application No. PCT/CN2016/079179, filed on 13 Apr. 2016, entitled "OLED Display Device And Display Apparatus Including The Same", which has not yet published and claims priority to Chinese Patent Application No. 201510320106.4, filed on 11 Jun. 2015, the contents of which are hereby incorporated in their entirety.

BACKGROUND

1. Technical Field

Embodiments of the present application relate to the field of display technology, and particularly to an OLED (Organic Light-Emitting Diode) display device and a display apparatus including the same.

2. Description of the Related Art

OLED display device generally comprises a substrate, an anode formed on the substrate, a hole functional layer located above the anode, a light-emitting layer located above the hole functional layer and corresponding to each sub-pixel, an electronic functional layer located above the light-emitting layer and a cathode located above the electronic functional layer.

Once the OLED display device is electrically energized, holes generated at the anode arrive at the light-emitting layer through the hole functional layer, electrons generated at the cathode arrive at the light-emitting layer through the electronic functional layer, and the light-emitting layer is excited by the holes and the electrons to emit a light.

It has been found by the inventor that the following problem exists at least in the prior art manufacturing process. A sub-pixel usually has a narrower width, that is, each light-emitting layer usually also has a narrower width, which causes errors easily during manufacturing of the light-emitting layer. Accordingly, prior art OLED display device usually encounters a color-mixing problem.

SUMMARY

In accordance with a first aspect of embodiments of the present application, an organic light-emitting diode OLED display device is provided. The device comprises: a substrate and n OLED display units formed on the substrate, in which n is an integer which is greater than 1;

wherein, the OLED display unit comprises: a first electrode, a first functional layer, a second electrode, a second functional layer, and a first light-emitting layer and a second light-emitting layer disposed between the first functional layer and the second functional layer; the first functional layer is disposed above the first electrode and the second functional layer is disposed below the second electrode, or, the first functional layer is disposed below the first electrode and the second functional layer is disposed above the second electrode;

wherein, the first light-emitting layer and the second light-emitting layer are disposed side by side in a horizontal direction, and, each of the light-emitting layers corresponds to at least two sub-pixels in the OLED display unit.

In accordance with a second aspect of embodiments of the present application, there provides an OLED display apparatus comprising any of the OLED display devices mentioned in the first aspect.

BRIEF DESCRIPTION OF THE DRAWINGS

In order to provide a more clear explanation of embodiments of the present invention, there is provided a brief introduction of the attached drawings used in the following description of the embodiments. Obviously, the drawings mentioned in the following description belong to some embodiments of the present invention. However, for those skilled in the art, other drawings may be achieved on the basis of these attached drawings without involving any inventive steps.

DETAILED DESCRIPTION OF THE EMBODIMENTS

In order to provide a more clear understanding of objects, technique solutions and advantages of embodiments of the present invention, the embodiments of the present invention will be further described hereinafter in detail and completely with reference to the attached drawings.

Figure 1:
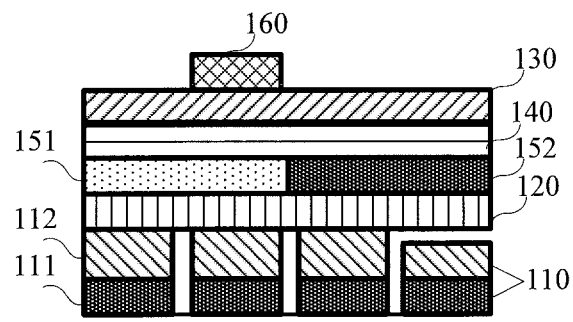
FIG. 1 is a structural schematic view showing an OLED display unit in an OLED display device according to an embodiment of the present invention.
Figure 2:
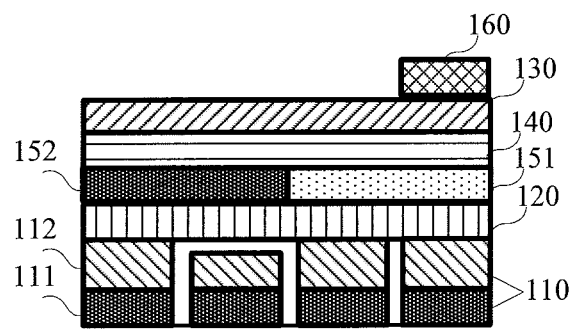
FIG. 2 is a structural schematic view showing an OLED display unit in an OLED display device according to another embodiment of the present invention.
Figure 3:
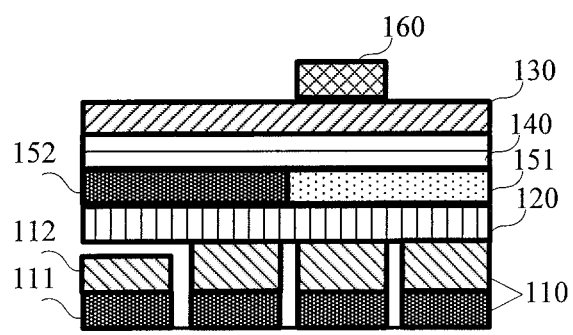
FIG. 3 is a structural schematic view showing an OLED display unit in an OLED display device according to still another embodiment of the present invention.
Figure 4:
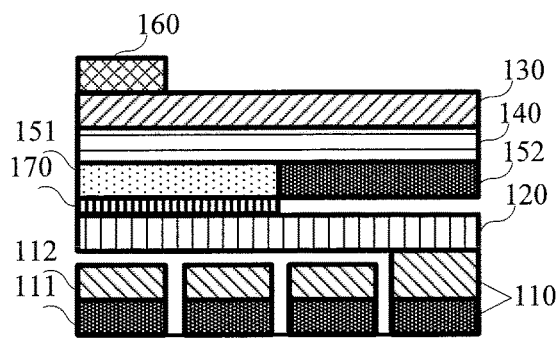
FIG. 4 is a structural schematic view showing an OLED display unit in an OLED display device according to yet another embodiment of the present invention.
Figure 5:
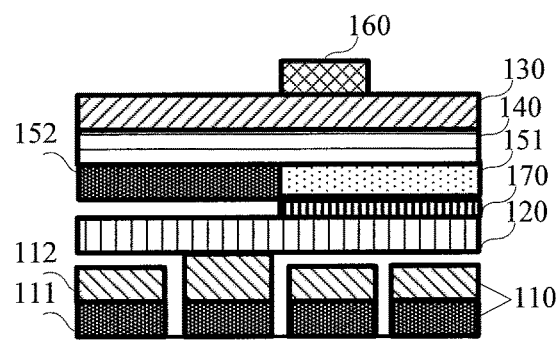
FIG. 5 is a structural schematic view showing an OLED display unit in an OLED display device according to another embodiment of the present invention.
Figure 6:
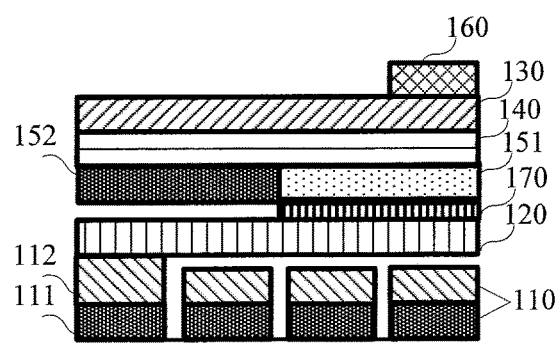
FIG. 6 is a structural schematic view showing an OLED display unit in an OLED display device according to yet another embodiment of the present invention.

An OLED display device is provided according to an embodiment of the present application, and, the OLED display device comprises a substrate and n OLED display units formed on the substrate, in which n is an integer which is greater than 1. Referring to FIG. 1, the OLED display unit may include, a first electrode 110, a first functional layer 120, a second electrode 130, a second functional layer 140, and a first light-emitting layer 151 and a second light-emitting layer 152 disposed between the first functional layer 120 and the second functional layer 140.

The first functional layer 120 is disposed above the first electrode 110 and the second functional layer 140 is disposed below the second electrode 130, or, the first functional layer 120 is disposed below the first electrode 110 and the second functional layer 140 is disposed above the second electrode 130.

One of the first electrode 110 and the second electrode 130 is a cathode, while the other is an anode. The functional layer corresponding to the cathode is an electronic functional layer, while the functional layer corresponding to the anode is a hole functional layer. Specifically, the first electrode 110 may be a cathode. In this case, the first functional layer 120 is an electronic functional layer, the second electrode 130 is an anode, and, the second functional layer 140 is a hole functional layer. Or, the first electrode 110 may be an anode, the first functional layer 120 is a hole functional layer, the second electrode 130 is a cathode, and, the second functional layer 140 is an electronic functional layer. As shown in the figures, herein, illustrated are examples in which the first electrode 110 is an anode, the first functional layer 120 is a hole functional layer, the second electrode 130 is a cathode, and, the second functional layer 140 is an electronic functional layer. Moreover, as shown in the figures, herein, illustrated are examples in which the hole functional layer 120 is disposed above the anode 110 and the electronic functional layer 140 is disposed below the cathode 130.

Specifically, the anode 110 may include a reflective electrode 111 and a transparent electrode 112. In this embodiment, the hole functional layer 120 may include a hole injection layer and a hole transport layer, the electronic functional layer 140 may include an electronic injection layer and an electronic transport layer.

In some embodiments, the first light-emitting layer 151 and the second light-emitting layer 152 may be disposed side by side in a horizontal direction, and, each of the light-emitting layers corresponds to at least two sub-pixels in the OLED display unit. In the embodiment shown in FIG. 1, each light-emitting layer corresponds to two sub-pixels. It should be mentioned that, herein, the horizontal direction denotes a left-right direction in these figures, a thickness denotes a length along an up-down direction in these figures, and a width denotes a length along the left-right direction in these figures.

It should be mentioned that, the OLED display unit in the embodiments is a virtualized unit which denotes a structure that will repeated continuously in the OLED display device along the horizontal direction It should also be mentioned that, once the OLED display device is electrically energized, holes are generated at the anode 110 of the n OLED display units in the OLED display device, and electrons are generated at the cathode 130. Holes generated at the anode 110 arrive at its corresponding light-emitting layer through the hole functional layer 120, electrons generated at the cathode 130 also arrive at its corresponding light-emitting layer through the electronic functional layer 140, and these light-emitting layers are excited by the holes and the electrons to emit a light of a color, and the light is displayed after passing through the cathode 130.

Figure 9:
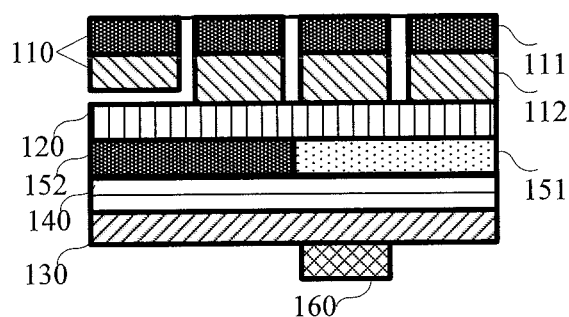
FIG. 9 is a structural schematic view showing an OLED display unit in an OLED display device according to a further embodiment of the present invention.

It should also be mentioned that, in case that, in a further embodiment shown in FIG. 9, the hole functional layer 120 is disposed below the anode 110 and the electronic functional layer 140 is disposed above the cathode 130, structure of the OLED display unit may be embodied to include the cathode 130, the electronic functional layer 140, the first light-emitting layer 151 and the second light-emitting layer 152 disposed above the electronic functional layer 140, the hole functional layer 120 disposed above the first light-emitting layer 151 and the second light-emitting layer 152, and the anode 110 disposed above the hole functional layer 120, and the description of this embodiment is omitted for clarity.

Concerning the above, in the OLED display device according to the embodiments, n OLED display units are formed on the substrate, and, the first light-emitting layer and the second light-emitting layer arranged side by side in the horizontal direction are disposed between the first functional layer and the second functional layer in the OLED display unit, and, each of the light-emitting layers corresponds to at least two sub-pixels in the OLED display unit. With the above configuration, a color-mixing problem that exists in a prior art OLED display device is solved, and an effect of alleviating the color-mixing is achieved.

In addition, each of the light-emitting layers is disposed to correspond to at least two sub-pixels, which increases a width of each of the light-emitting layers, thereby decreasing manufacturing difficulty of the light-emitting layer and increasing productivity of the OLED display device. Meanwhile, the color-mixing of the OLED display device is alleviated, which improves manufacturing yield of the OLED display device and reduces manufacturing cost of the OLED display device.

In a possible implementation of the abovementioned embodiment, the first electrode 110 may comprise m components, in which m is an integer which is greater than 2. The m components are disposed side by side in the horizontal direction, and thicknesses of the m components include a first thickness and a second thickness, the first thickness being greater than the second thickness. Similarly, the second electrode 130 may also comprise m components, and its arrangement is similar to arrangement of the m components of the first electrode 110.

In this embodiment, a thickness of the m components either may be equal to a thickness of the transparent electrode 112 shown in FIG. 1 or may be equal to a total thickness of the reflective electrode 111 and the transparent electrode 112, and it is not limited herein. Moreover, hereinafter, excepting for being mentioned specially, a thickness of the transparent electrode 112 is taken as an example for this thickness mentioned herein.

In an example in which m is 4, referring to FIG. 1, the anode 110 may be formed of four components (each of the light-emitting layers corresponds to two of the four components) disposed side by side in the horizontal direction, and thicknesses of the four components may be as follows: in FIG. 1, the first component, the second component and the third component have the first thickness, while the fourth component has the second thickness. It should also be mentioned that, in FIG. 1 and subsequent FIGS. 2-8, the first component, the second component, the third component and the fourth component are four components arranged in a preset sequential order from the left to the right in the figures.

In prior art, in order to obtain the sub-pixel with three different colors R, G and B, the anode 110 usually is designed to have three different thicknesses. However, in this embodiment, an anode having only two different thicknesses is used. Compared with the prior art, it cuts down manufacturing process of an anode having three different thicknesses into manufacturing process of the one having two different thicknesses, which decreases manufacturing complexity of the anode and increases productivity of the anode, thereby increasing productivity of the OLED display device.

Each of the m components corresponds to one sub-pixel, and, a color conversion layer 160 is disposed to a side of the second electrode 130 facing a preset component of the first electrode 110 but being away from the light-emitting layer. The color conversion layer 160 is for converting a light with one color, emitted by the light-emitting layer, into one with other color.

For example, referring to FIG. 1, the color conversion layer 160 is disposed to an upper side of the cathode 130 facing a component corresponding to the sub-pixel R.

Optionally, the m sub-pixels corresponding to the m components may be arrayed in a pentile arrangement. That is, the m sub-pixels corresponding to the m components may be cyclically arrayed with RGBG, GRGB, BGRG or GBGR as a repeating unit.

In this embodiment, the m sub-pixels are arrayed, for example, in sequential order abovementioned. Optionally, arrangement of the sub-pixels in each of the OLED display unit is not limited to the one which is presented in the present embodiment, as long as these sub-pixels in the n OLED display units of the OLED display device are cyclically arrayed with RGBG as a repeating unit in the horizontal direction.

The m sub-pixels are arrayed in the preset sequential order abovementioned, which increases pixel density and resolution of the OLED display device consisted of the n OLED display units.

Optionally, as a possible implementation, a thickness of the components corresponding to the sub-pixel R and the sub-pixel G is the first thickness, and, a thickness of the component corresponding to the sub-pixel B is the second thickness.

Specifically, when, for example, m is 4 and the preset sequential order is of GRGB, referring to FIG. 1, thicknesses of the four components may be shown in this figure. When the preset sequential order is of GBGR, referring to FIG. 2, thicknesses of the four components may be shown in this figure. Similarly, when the preset sequential order is of BGRG, referring to FIG. 3, thicknesses of the four components may be shown in this figure.

Optionally, a wavelength of a light, namely, color of the light, corresponding to each light-emitting layer will vary based on change of the total thickness between the anode 110 and the cathode 130, accordingly, in this embodiment, a thickness of the corresponding component of the anode 110 may be decreased by means of addition of an auxiliary layer 170. Accordingly, as another possible implementation, m is 4, the sub-pixels corresponding to two adjacent components of the 4 components share the first light-emitting layer, and, the sub-pixels corresponding to the other two adjacent components of the 4 components share the second light-emitting layer. When the m sub-pixels are cyclically arrayed with RGBG as a repeating unit, the sub-pixels which correspond to the first component and the second component of the 4 components share the first light-emitting layer 151, the sub-pixels which correspond to the third component and the fourth component share the second light-emitting layer 152, wherein, the sub-pixels which share the first light-emitting layer may comprise an R sub-pixel and a G sub-pixel, and the sub-pixels which share the second light-emitting layer may comprise a B sub-pixel and a G sub-pixel. The OLED display unit may further comprise an auxiliary layer 170 disposed within a preset range of width between the anode 110 and the cathode 130, the preset range of width being a range of a width to which the first light-emitting layer 151 corresponds, and the auxiliary layer 170 having a preset thickness. Under these circumstances, in accordance with a sequential order in which the m sub-pixels are arrayed cyclically in the OLED display unit, these are presented as follows.

When the m sub-pixels are cyclically arrayed with RGBG as a repeating unit, the first component, the second component, the third component and the fourth component correspond respectively to an R sub-pixel, a G sub-pixel, a B sub-pixel and a G sub-pixel arranged in a sequential order in the RGBG repeating unit, and, thicknesses of the first component, the second component and the third component are the second thickness, while a thickness of the fourth component is the first thickness. For example, refers to FIG. 4, which is a structural schematic view of an OLED display unit.

When the m sub-pixels are cyclically arrayed with BGRG as a repeating unit, the first component, the second component, the third component and the fourth component correspond respectively to a B sub-pixel, a G sub-pixel, an R sub-pixel and a G sub-pixel arranged in a sequential order in the BGRG repeating unit, and, thicknesses of the first component, the third component and the fourth component are the second thickness, while a thickness of the second component is the first thickness. For example, refers to FIG. 5, which is another structural schematic view of an OLED display unit.

When the m sub-pixels are cyclically arrayed with GBGR as a repeating unit, the first component, the second component, the third component and the fourth component correspond respectively to a G sub-pixel, a B sub-pixel, a G sub-pixel and an R sub-pixel arranged in a sequential order in the GBGR repeating unit, and, thicknesses of the second component, the third component and the fourth component are the second thickness, while a thickness of the first component is the first thickness. For example, refers to FIG. 6, which is yet another structural schematic view of an OLED display unit.

Figure 10:
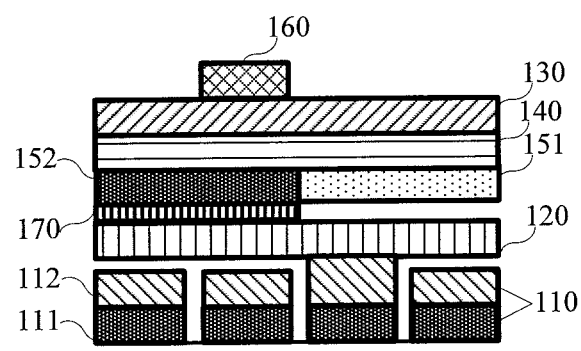
FIG. 10 is a structural schematic view showing an OLED display unit in an OLED display device according to a still further embodiment of the present invention.

When the m sub-pixels are cyclically arrayed with GRGB as a repeating unit, the first component, the second component, the third component and the fourth component correspond respectively to a G sub-pixel, an R sub-pixel, a G sub-pixel and a B sub-pixel arranged in a sequential order in the GRGB repeating unit, and, thicknesses of the first component, the second component and the fourth component are the second thickness, while a thickness of the third component is the first thickness. For example, refers to FIG. 10, which is a further structural schematic view of an OLED display unit.

Optionally, a range of luminescent wavelength of a luminescent material used for each light-emitting layer is required to fall into between wavelengths of colors of the at least two sub-pixels corresponding to the each light-emitting layer. As to three primary colors consisted of red color, green color and blue color, a wavelength of the green color falls into between that of the red color and that of the blue color, accordingly, in this embodiment, the sub-pixel R and the sub-pixel G share one light-emitting layer, while the sub-pixel G and the sub-pixel B share another light-emitting layer.

For example, in order to obtain lights of two colors R and G, green luminescent material may be adopted as the light-emitting layer which is shared by the sub-pixel R and the sub-pixel G, and, in order to obtain lights of two colors G and B, light blue luminescent material may be adopted as the light-emitting layer which is shared by the sub-pixel G and the sub-pixel B. Of course, in practical selection, other luminescent material may be selected in accordance with practical requirements, and this is not limited in this embodiment.

It should be pointed out that, in the abovementioned embodiment, these thicknesses of the m components are presented only as an example. Optionally, these thicknesses of the m components may be designed in any other manner, and it is not limited in this embodiment. Moreover, for specific values of the first thickness and the second thickness, they may be set in accordance with selected color luminescent material in practice, and this is not limited in this embodiment.

It should also be pointed out that, in this embodiment, these sub-pixels obtained by means of changing the thickness of the anode 110 or by means of addition of the auxiliary layer 170 are presented only as an example. Optionally, these sub-pixels may be obtained by means of changing the thickness of any of the layers between the anode 110 and the cathode 130 in accordance with practical requirements, and this is not limited in this embodiment.

Optionally, the preset component of the m components may be a component corresponding to the sub-pixel R of these sub-pixels.

As a possible implementation, the color conversion layer 160 may be formed on an upper surface of the second electrode 130 facing the component corresponding to the sub-pixel R. For example, referring to FIG. 1 to FIG. 6, the color conversion layer 160 may be formed on the upper surface of the cathode 130 facing the component corresponding to the sub-pixel R.

Optionally, the cathode 130 will be damaged in certain degrees when the color conversion layer 160 is formed on the surface of the cathode 130, and thus, it will lead to failure manufacturing of the OLED display device, which causes poor yield of the OLED display device. In order to solve the abovementioned problem, the OLED display unit may further comprise a protective layer 180 disposed between the cathode 130 and the color conversion layer 160.

Figure 7:
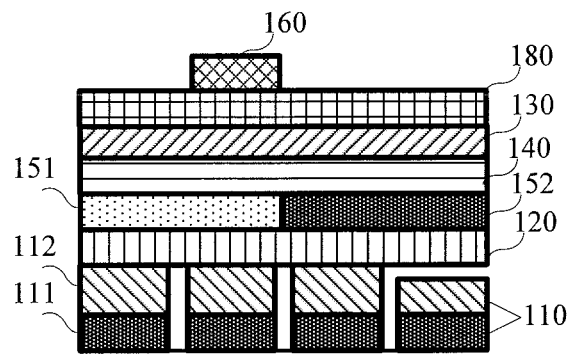
FIG. 7 is a structural schematic view showing an OLED display unit in an OLED display device according to still another embodiment of the present invention.
Figure 8:
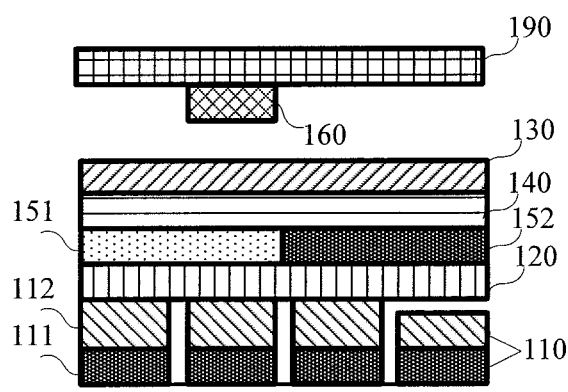
FIG. 8 is a structural schematic view showing an OLED display unit in an OLED display device according to yet another embodiment of the present invention.

For example, in combination with FIG. 1, referring to FIG. 7, which is a schematic view showing structure of an OLED display unit shown in FIG. 1 with the addition of a protective layer 180. Similarly, in combination with these structures shown in FIGS. 2 to 6, schematic views which show any structures of the OLED display units with the addition of a protective layer 180 can be derived easily, and herein, these are not illustrated one by one.

As another possible implementation, the OLED display device further comprises a cover plate 190 disposed above the n OLED display units; and, the color conversion layer 160 is formed on a lower surface of the cover plate 190 facing the component corresponding to the sub-pixel R. For example, in combination with FIG. 1, referring to FIG. 8, which is a schematic view where a color conversion layer 160 is formed on a lower surface of a cover plate 190. Similarly, in combination with these structures shown in FIGS. 2 to 6, schematic views which show any structures of the OLED display unit where a color conversion layer 160 is formed on a lower surface of a cover plate 190 can be derived easily, and herein, these are not illustrated one by one.

By means of using the light-emitting layer in combination with the color conversion layer 160, the present embodiment obtains a red light, which improves efficiency of obtaining a red light, and enhances performance of the OLED display device manufactured.

In addition, the present embodiment obtains a red light by means of using the light-emitting layer in combination with the color conversion layer 160 while obtaining lights of other colors using the light-emitting layer directly. Compared to the prior art where lights of different colors are obtained by means of passing a white light through a color film, it has a great enhancement in performance while reducing power consumption required for the OLED display device.

Operational principle of the abovementioned OLED display device will be introduced briefly hereinafter. An OLED display unit of an OLED display device is taken as an example of display unit shown in FIG. 1, a green light can be emitted when the first light-emitting layer 151 is excited by the holes and the electrons. The green light, which is emitted by the first light-emitting layer 151 but corresponds to the first component, is displayed directly after passing through the cathode 130. The green light, which is emitted by the first light-emitting layer 151 but corresponds to the second component, passes through the cathode 130, arrives at the color conversion layer 160 and is converted by the color conversion layer 160 into a red light, and then is displayed. Similarly, a green light and a blue light can be emitted in a sequential order when the second light-emitting layer 152 is excited by the holes and the electrons. The green light, which is emitted by the second light-emitting layer 152 but corresponds to the third component, is displayed directly after passing through the cathode 130. The blue light, which is emitted by the second light-emitting layer 152 but corresponds to the fourth component, is displayed directly after passing through the cathode 130. In this manner, a pixel cycle of GRGB in the horizontal direction can be achieved, for each of the OLED display units.

An OLED display apparatus is further provided according to an embodiment of the present application, and, the OLED display apparatus may comprise the OLED display device according to the abovementioned embodiments. The details of the OLED display device according to this embodiment are omitted for clarity.

Concerning the above, in the OLED display apparatus according to the embodiments comprising the OLED display device, n OLED display units are formed on the substrate of the OLED display device, and, the first light-emitting layer and the second light-emitting layer arranged side by side in the horizontal direction are disposed between the first functional layer and the second functional layer in the OLED display unit, and, each of the light-emitting layers corresponds to at least two sub-pixels in the OLED display unit. With the above configuration, a color-mixing problem that exists in a prior art OLED display device is solved, and an effect of alleviating the color-mixing is achieved.

In addition, each of the light-emitting layers is disposed to correspond to at least two sub-pixels, which increases a width of each of the light-emitting layers, thereby decreasing manufacturing difficulty of the light-emitting layer and increasing productivity of the OLED display device. Meanwhile, the color-mixing of the OLED display device is alleviated, which improves manufacturing yield of the OLED display device and reduces manufacturing cost of the OLED display device.

The abovementioned embodiments of the present application are listed only for facilitating the description, but not be in accordance with priorities of these embodiments.

The above description is merely used to illustrate particular embodiments of the present invention, but not to limit the present invention. It should be understood by those skilled in the art that, all of changes, replacements and modifications made within principles and spirit of the present application should be included within the scope of the present application. Therefore, the scope of the present application is defined in the claims of the present application.

What is claimed is:

1. An OLED display device, comprising:
a substrate and n OLED display units formed on the substrate, in which n is an integer which is greater than 1;
wherein, the OLED display unit comprises: a first electrode, a first functional layer, a second electrode, a second functional layer, and a first light-emitting layer and a second light-emitting layer disposed between the first functional layer and the second functional layer; the first functional layer is disposed above the first electrode and the second functional layer is disposed below the second electrode, or, the first functional layer is disposed below the first electrode and the second functional layer is disposed above the second electrode;
wherein, the first light-emitting layer and the second light-emitting layer are disposed side by side in a horizontal direction, and, each of the light-emitting layers corresponds to at least two sub-pixels in the OLED display unit;
wherein, the first electrode comprises m components, in which m is an integer which is greater than 2; the m components are disposed side by side in the horizontal direction and thickness of the m components include a first thickness and a second thickness, the first thickness being greater than the second thickness; and
wherein, each of the m components corresponds to one sub-pixel, a color conversion layer is disposed to a side of the second electrode facing a preset component of the components of the first electrode but being away from the light-emitting layer, and, m sub-pixels which correspond to the m components are cyclically arrayed with RGBG, GRGB, BGRG or GBGR as a repeating unit.

2. The device of claim 1, wherein, thicknesses of the components corresponding to the sub-pixel R and the sub-pixel G are the first thickness, and, a thickness of the component corresponding to the sub-pixel B is the second thickness.

3. The device of claim 1, wherein, the m is 4;
the sub-pixels corresponding to two adjacent components of the 4 components share the first light-emitting layer, the sub-pixels corresponding to the other two adjacent components of the 4 components share the second light-emitting layer, the sub-pixels which share the first light-emitting layer comprises an R sub-pixel and a G sub-pixel, and the sub-pixels which share the second light-emitting layer comprises a B sub-pixel and a G sub-pixel; wherein, the OLED display unit further comprises an auxiliary layer disposed within a preset range of width between the first electrode and the second electrode, the preset range of width being a range of a width to which the first light-emitting layer corresponds, and the auxiliary layer having a preset thickness;
when the m sub-pixels are cyclically arrayed with RGBG as a repeating unit, the first component, the second component, the third component and the fourth component correspond respectively to an R sub-pixel, a G sub-pixel, a B sub-pixel and a G sub-pixel arranged in a sequential order in the RGBG repeating unit, and, thicknesses of the first component, the second component and the third component are the second thickness, while a thickness of the fourth component is the first thickness;
when the m sub-pixels are cyclically arrayed with BGRG as a repeating unit, the first component, the second component, the third component and the fourth component correspond respectively to a B sub-pixel, a G sub-pixel, an R sub-pixel and a G sub-pixel arranged in a sequential order in the BGRG repeating unit, and, thicknesses of the first component, the third component and the fourth component are the second thickness, while a thickness of the second component is the first thickness;
when the m sub-pixels are cyclically arrayed with GBGR as a repeating unit, the first component, the second component, the third component and the fourth component correspond respectively to a G sub-pixel, a B sub-pixel, a G sub-pixel and an R sub-pixel arranged in a sequential order in the GBGR repeating unit, and, thicknesses of the second component, the third component and the fourth component are the second thickness, while a thickness of the first component is the first thickness; and
when the m sub-pixels are cyclically arrayed with GRGB as a repeating unit, the first component, the second component, the third component and the fourth component correspond respectively to a G sub-pixel, an R sub-pixel, a G sub-pixel and a B sub-pixel arranged in a sequential order in the GRGB repeating unit, and, thicknesses of the first component, the second component and the fourth component are the second thickness, while a thickness of the third component is the first thickness.

4. The device of claim 1, wherein, the preset component is one of the components corresponding to the sub-pixel R.

5. The device of claim 4, wherein, the color conversion layer is formed to a surface of the second electrode facing the component corresponding to the sub-pixel R but being away from the light-emitting layer.

6. The device of claim 5, wherein, the OLED display unit further comprises a protective layer disposed between the second electrode facing the component corresponding to the sub-pixel R and the color conversion layer.

7. The device of claim 4, wherein, the OLED display unit further comprises a cover plate disposed above the n OLED display units; and
the color conversion layer is formed on a lower surface of the cover plate facing the component corresponding to the sub-pixel R.

8. The device of claim 1, wherein, a range of luminescent wavelength of a luminescent material used for each light-emitting layer falls into between wavelengths of colors of the at least two sub-pixels corresponding to the each light-emitting layer.

9. The device of claim 1, wherein,
the first electrode comprises a cathode, the first functional layer comprises an electronic functional layer, the second electrode comprises an anode, the second functional layer comprises a hole functional layer;
or,
the first electrode comprises an anode, the first functional layer comprises a hole functional layer, the second electrode comprises a cathode, the second functional layer comprises an electronic functional layer.

10. An OLED display apparatus, comprising the OLED display device of claim 1.

* * * * *